United States Patent
Ito et al.

(10) Patent No.: US 8,642,362 B2
(45) Date of Patent: Feb. 4, 2014

(54) METHOD FOR PRODUCING LIGHT-EMITTING DIODE DEVICE

(75) Inventors: Hisataka Ito, Osaka (JP); Yasushi Inoue, Osaka (JP); Sadahito Misumi, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/403,467

(22) Filed: Feb. 23, 2012

(65) Prior Publication Data

US 2012/0220059 A1 Aug. 30, 2012

(30) Foreign Application Priority Data

Feb. 24, 2011 (JP) ................. 2011-038702

(51) Int. Cl.
 *H01L 33/52* (2010.01)
(52) U.S. Cl.
 USPC .................... 438/26; 257/E33.059
(58) Field of Classification Search
 None
 See application file for complete search history.

(56) References Cited

U.S. PATENT DOCUMENTS

2006/0029811 A1* 2/2006 Sugioka et al. ............... 428/413

FOREIGN PATENT DOCUMENTS

JP 2005-158932 A 6/2005

* cited by examiner

*Primary Examiner* — Seahvosh Nikmanesh
(74) *Attorney, Agent, or Firm* — Sughrue Mion, PLLC

(57) ABSTRACT

A method for producing a light-emitting diode device includes the steps of: preparing a light-emitting laminate including an optical semiconductor layer, and an electrode unit formed on the optical semiconductor layer; forming an encapsulating resin layer on the optical semiconductor layer so as to cover the electrode unit, the encapsulating resin layer containing a light reflection component; partially removing the encapsulating resin layer so as to expose the top face of the electrode unit, thereby producing a light-emitting diode element; and disposing the light-emitting diode element and a base substrate provided with terminals so that the light-emitting diode element and the base substrate face each other, and that the electrode unit and the terminals are electrically connected, thereby flip chip mounting the light-emitting diode element on the base substrate.

2 Claims, 2 Drawing Sheets

(a)

(b)

(c)

(d)

(e)

(f)

# METHOD FOR PRODUCING LIGHT-EMITTING DIODE DEVICE

CROSS-REFERENCE TO RELATED APPLICATION

The present application claims priority from Japanese Patent Application No. 2011-038702 filed on Feb. 24, 2011, the contents of which are hereby incorporated by reference into this application.

BACKGROUND OF THE INVENTION

1. Field of the Invention

The present invention relates to a method for producing a light-emitting diode device, particularly to a method for producing a light-emitting diode device for optical use.

2. Description of Related Art

A light-emitting diode device includes a base substrate having a terminal, and a light-emitting diode element mounted thereon, wherein the light-emitting diode element includes an electrode unit, an optical semiconductor layer connected to the electrode unit, and an encapsulating resin layer that encapsulates the optical semiconductor layer.

In such a light-emitting diode device, conventionally, the electrode unit of the light-emitting diode element and the terminal of the base substrate are connected by wire bonding. However, because of an increased amount of heat involved with improved brightness, and a decrease in brightness from wire shades, in recent years, a method by which a light-emitting diode element is flip mounted on the base substrate has been examined to improve light-extraction efficiency.

To be specific, for example, Japanese Unexamined Patent Publication No. 2005-158932 has proposed disposing the electrode unit of the light-emitting diode element to face the terminal of the base substrate, and directly connecting them electrically.

In Japanese Unexamined Patent Publication No. 2005-158932, to further improve light-extraction efficiency, a diffusion film formed from a metal having a high reflectance is provided on the surface of the optical semiconductor layer.

SUMMARY OF THE INVENTION

However, the method described in Japanese Unexamined Patent Publication No. 2005-158932 is disadvantageous in that the diffusion film has to be provided separately from the optical semiconductor layer or encapsulating resin layer, and therefore it is troublesome to such an extent.

An object of the present invention is to provide a method for producing a light-emitting diode: with the method, while light-extraction efficiency is sufficiently improved, a light-emitting diode device can be produced easily.

A method for producing a light-emitting diode device of the present invention includes the steps of: preparing a light-emitting laminate including an optical semiconductor layer, and an electrode unit formed on the optical semiconductor layer; forming an encapsulating resin layer on the optical semiconductor layer so as to cover the electrode unit, the encapsulating resin layer containing a light reflection component; partially removing the encapsulating resin layer so as to expose the top face of the electrode unit, thereby producing a light-emitting diode element; and disposing the light-emitting diode element and a base substrate provided with terminals so that the light-emitting diode element and the base substrate face each other and that the electrode unit and the terminals are electrically connected, thereby flip chip mounting the light-emitting diode element on the base substrate.

In the method for producing a light-emitting diode device of the present invention, it is preferable that in the step of preparing the light-emitting laminate, the light-emitting laminate is formed on a support substrate, and the method further includes a step of removing the support substrate from the optical semiconductor layer or removing a lower portion of the support substrate after the step of forming the encapsulating resin layer and before the step of producing a light-emitting diode element.

In a light-emitting diode device obtained by the method of the present invention, the encapsulating resin layer contains a light reflection component, and therefore the light reflection function can be exhibited, and a trouble of providing a diffusion film separately from the encapsulating resin layer as described in Japanese Unexamined Patent Publication No. 2005-158932 can be avoided.

Thus, while improving light-extraction efficiency of the light-emitting diode device, the light-emitting diode device can be produced easily.

Furthermore, an encapsulating resin layer is formed on the optical semiconductor layer so as to cover the electrode unit, and the encapsulating g resin layer is partially removed so as to expose the top face of the electrode unit, and therefore the faces excluding the top face of the electrode unit can be encapsulated with the encapsulating resin layer.

That is, while encapsulating in the faces other than the top face of the electrode unit with the encapsulating resin layer, the top face of the electrode unit can be exposed.

Thus, damages to the electrode unit at the time of exposing the top face of the electrode unit can be effectively prevented.

DETAILED DESCRIPTION OF THE INVENTION

Figure 1:
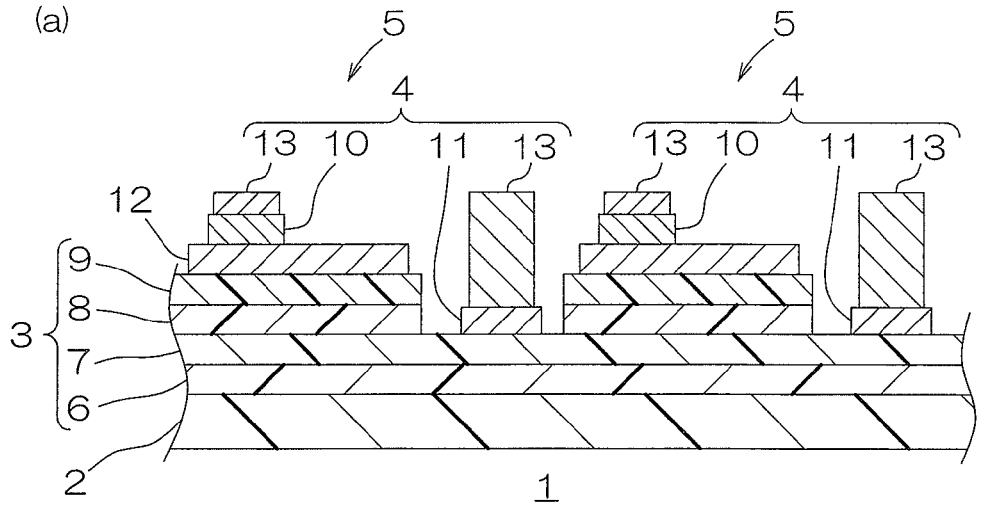
FIG. 1 is a process diagram for illustrating an embodiment of a method for producing a light-emitting diode device of the present invention, (a) illustrating a step of preparing a light-emitting laminate plate, (b) illustrating a step of forming an encapsulating resin layer, and (c) illustrating a step of removing a base substrate.
Figure 1:
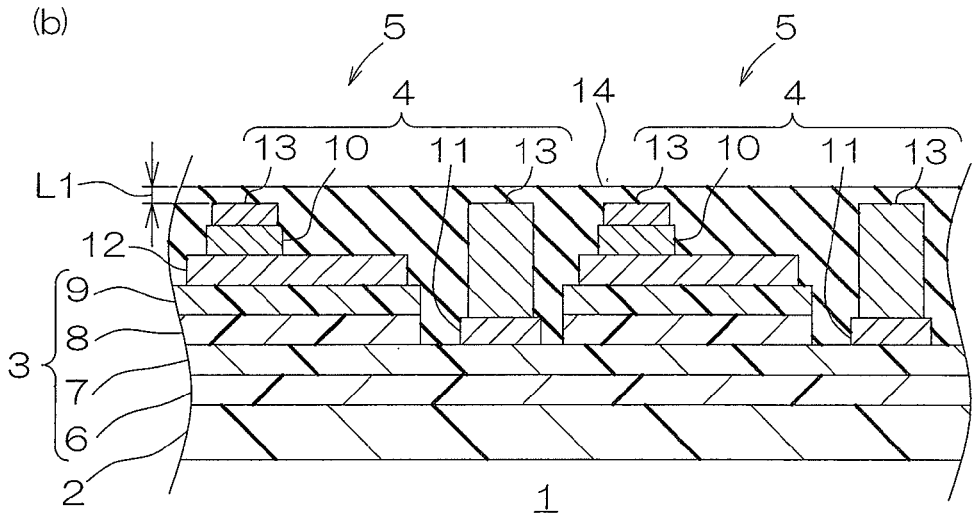
Figure 1:
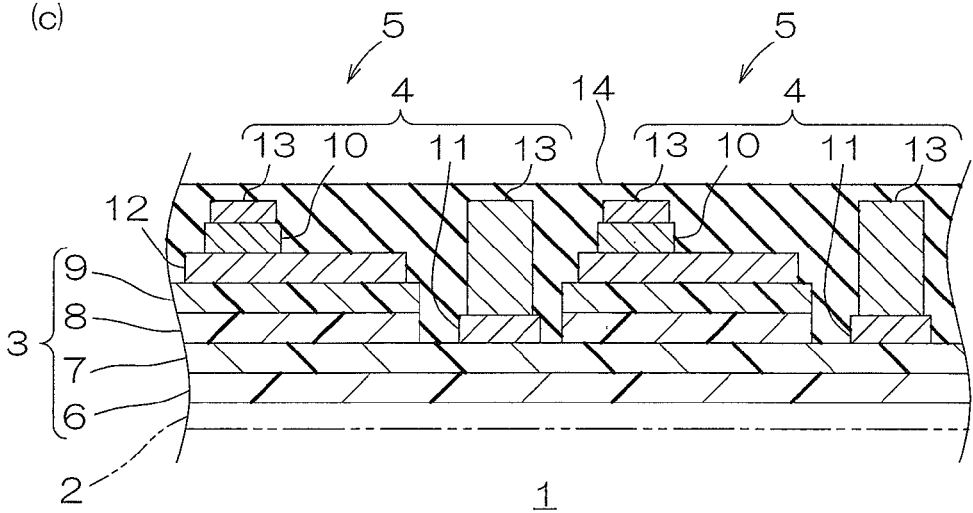
Figure 2:
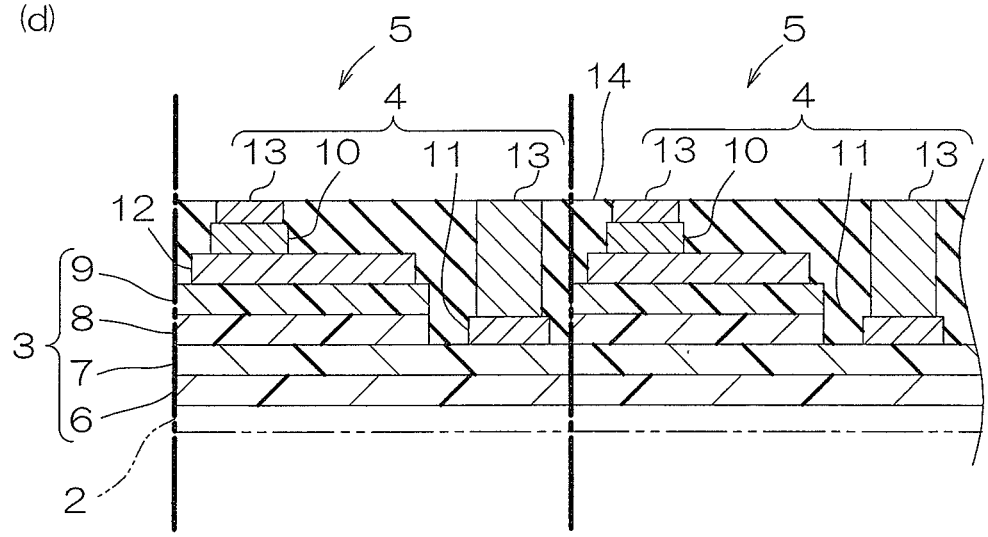
FIG. 2 illustrates, subsequent to FIG. 1, a process diagram for illustrating an embodiment of a method for producing a light-emitting diode device of the present invention, (d) illustrating a step of partially removing the encapsulating resin layer so as to expose the top face of the bump, and cutting the light-emitting laminate plate, thereby producing a plurality of light-emitting laminates and light-emitting diode elements, (e) illustrating a step of disposing the light-emitting diode element and the base substrate so as to face each other, and (f) illustrating a step of flip chip mounting the light-emitting diode element on the base substrate.
Figure 2:
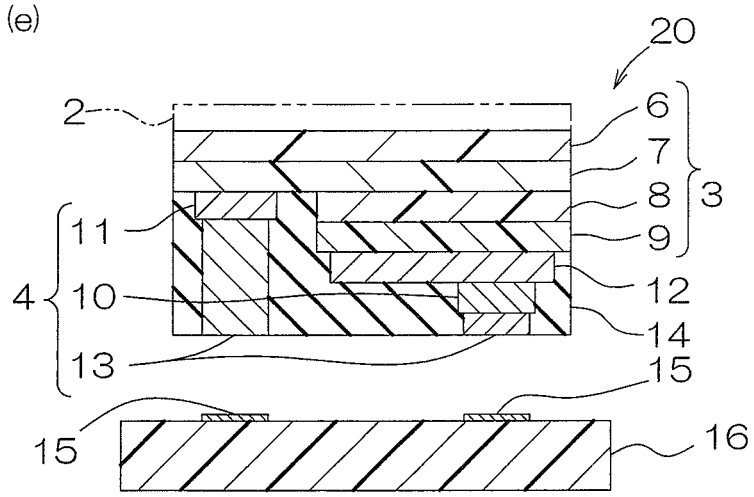
Figure 2:
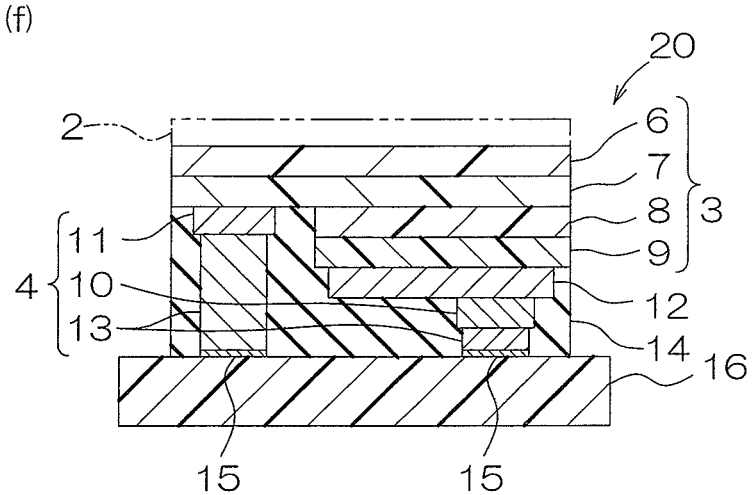

FIG. 1 and FIG. 2 show process diagrams for illustrating embodiments of a method for producing a light-emitting diode device of the present invention.

In this method, as shown in FIG. 1(a), first, a light-emitting laminate plate 1 is prepared.

The light-emitting laminate plate 1 includes a support substrate 2, an optical semiconductor layer 3 formed thereon, and an electrode unit 4 formed thereon; and formed into a plate in which a plurality of light-emitting laminates 5 are arranged in arrays (although not shown in FIG. 1, a generally disc shape). That is, a light-emitting laminate 5 includes, in the region corresponding to the single light-emitting laminate 5, the support substrate 2, the optical semiconductor layer 3, and the electrode unit 4.

The support substrate 2 is formed so as to match the contour of the light-emitting laminate plate 1. For example, the support substrate 2 is formed into a generally disc shape when viewed from the top. The support substrate 2 supports the optical semiconductor layer 3 and the electrode unit 4 to be described next.

Examples of supporting materials that form the support substrate 2 include $Al_2O_3$(sapphire), SiC, Si, and GaN. A preferable example is sapphire.

The support substrate 2 has a thickness of, for example, 100 to 1000 μm, preferably 200 to 800 μm.

The optical semiconductor layer 3 includes a buffer layer 6, an N-semiconductor layer 7 formed thereon, a light-emitting layer 8 formed thereon, and a P-semiconductor layer 9 formed thereon.

The buffer layer 6 is formed on the entire top face of the support substrate 2. The buffer layer 6 buffers mismatching lattice constants between the support substrate 2 and the N-semiconductor layer 7 to be described next.

Examples of buffer materials that form the buffer layer 6 include semiconductors such as element semiconductors (single element semiconductors), oxide semiconductors, and compound semiconductors (excluding oxide semiconductors).

Examples of element semiconductors include 4B elements (4B elements in long-form periodic table, hereinafter referred to as 4B elements) such as Si, Ge, and Sn.

Examples of oxide semiconductors include oxides of main group elements such as $Al_2O_3$, ZnO, and $SnO_2$; and oxides of transition elements such as $TiO_2$, $V_2O_5$, $Cr_2O_3$, $MnO_2$, $Fe_2O_3$, NiO, and $Cu_2O$. These can be used singly, or can be used in combination.

Examples of compound semiconductors include compounds in which a plurality of elements excluding Oxygen are bonded, such as compounds of 3B elements and 5B elements including AlN, AlP, AlAs, AlSb, GaN, GaP, GaAs, GaSb, InN, InP, InAs, InSb, AlGaN, InGaN, AlInN, and AlGaInN; and compounds of 2B elements and 6B elements including ZnS, SnSe, and ZnTe. Preferable examples are compounds of 3B elements and 5B elements.

Of the above-described semiconductors, preferable examples are compound semiconductors.

The buffer layer 6 has a thickness of, for example, 0.5 to 200 nm, preferably 1 to 100 nm.

The N-semiconductor layer 7 is formed on the entire top surface of the buffer layer 6. N-semiconductors that form the N-semiconductor layer 7 are not particularly limited, and known N-semiconductors can be used, including impure semiconductors in which impurities of 5B elements, and further 4B elements are doped (added) in a slight amount to the above-described semiconductors.

The light-emitting layer 8 is formed on the top face of the buffer layer 6 into a pattern that matches the light-emitting laminates 5. To be specific, the light-emitting layer 8 are arranged with a space provided therebetween in a direction (in the direction perpendicular to the thickness direction, the surface direction, to be specific, the left-right direction and the depth direction of the sheet in FIG. 1) along the light-emitting laminate plate 1. That is, the light-emitting layers 8 allow, at spaces between them, the top face of the N-semiconductor layer 7 to expose.

Light-emitting materials that form the light-emitting layer 8 include the semiconductors given as the examples of the semiconductors of the above-described buffer layer 6, and preferably compound semiconductors are used.

The light-emitting layer 8 has a thickness of, for example, 20 to 300 nm, preferably 30 to 200 nm.

The P-semiconductor layer 9 is formed on the entire top face of the light-emitting layer 8, into the same pattern as that of the light-emitting layer 8. P-semiconductors that form the P-semiconductor layer 9 are not particularly limited, and include known P-semiconductors, for example, impure semiconductors in which impurities of 3B elements, and 2A elements are doped (added) in a slight amount to the above-described semiconductor. Examples of 2A elements include alkaline earth metals such as Be and Mg.

The electrode unit 4 includes an anode 10 and a cathode 11.

The anode 10 is formed above the P-semiconductor layer 9 so as to sandwich a transparent electrode 12, and is electrically connected to the P-semiconductor layer 9 with the transparent electrode 12 interposed therebetween.

The transparent electrode 12 is formed on the top face of the P-semiconductor layer 9, and is disposed so as to be included in the P-semiconductor layer 9 when projected in the thickness direction. Examples of electrode materials that form the transparent electrode 12 include metal oxides such as indium tin oxide (ITO), zinc oxide (ZnO), and tin oxide ($SnO_2$), and the transparent electrode 12 has a thickness of, for example, 10 to 200 nm.

The anode 10 is formed into a pattern that is included in the transparent electrode 12 when projected in the thickness direction.

Examples of electrode materials that form the anode 10 include gold and aluminum. A preferable example is gold. The anode 10 has a thickness of, for example, 10 to 300 nm, preferably 20 to 200 nm.

The cathode 11 is formed on the N-semiconductor layer 7, and is formed, to be specific, on the top face of the N-semiconductor layer 7 exposed from the P-semiconductor layer 9 and the light-emitting layer 8. The cathode 11 is electrically connected to the N-semiconductor layer 7.

Examples of electrode materials that form the cathode 11 include gold and aluminum. A preferable example is gold. The cathode 11 has a thickness of, for example, 10 to 300 nm, preferably 20 to 200 nm.

The electrode unit 4 also includes bumps 13.

The bumps 13 are formed on the top face of the anode 10 and the top face of the cathode 11. The bumps 13 are formed into a pattern so that the bumps 13 are included in the anode 10 and the cathode 11, respectively, when viewed from the top.

Examples of materials that form the bumps 13 include conductors such as gold, copper, silver, lead, tin, and alloys thereof (to be specific, solder). A preferable example is gold.

The thickness of the bumps 13 are adjusted so that the top face of the bump 13 that is formed on the top face of the anode 10 and the top face of the bump 13 that is formed on the top face of the cathode 11 have the same height. That is, the thickness of the bumps 13 are adjusted so that the bumps 13 are at the same position when the bumps 13 are projected in the surface direction (direction perpendicular to the thickness direction).

To prepare this light-emitting laminate plate 1, first, the support substrate 2 is prepared, and the optical semiconductor layer 3 is laminated thereon by, for example, a known growth method such as epitaxy, and thereafter, the electrode unit 4 is laminated by a known patterning method. The light-emitting layer 8 and the P-semiconductor layer 9 in the optical semiconductor layer 3 are formed after the above-described growth method, for example, by etching (described later) with a mask, into the above-described pattern.

Then, as shown in FIG. 1(b), in this method, the encapsulating resin layer 14 is formed on the optical semiconductor layer 3 so as to cover the electrode unit 4.

The encapsulating resin that forms the encapsulating resin layer 14 contains, for example, an encapsulating material and a light reflection component.

The encapsulating material is not particularly limited, and include, for example, thermosetting resins such as thermosetting silicone resin, epoxy resin, thermosetting polyimide resin, phenolic resin, urea resin, melamine resin, unsaturated polyester resin, diallyl phthalate resin, and thermosetting urethane resin. Preferable examples are thermosetting silicone resin, and epoxy resin.

Examples of light reflection components include white compounds, to be specific, white pigments.

Examples of such white pigments include white inorganic pigments. Examples of white inorganic pigments include oxides such as titanium oxide, zinc oxide, and zirconium oxide; carbonates such as white lead (lead carbonate), and calcium carbonate; and clay minerals such as kaolin (kaolinite).

A preferable example of white inorganic pigments is oxide, and a more preferable example is titanium oxide.

When titanium oxide is used, characteristics such as a high whiteness degree, a high light reflectivity, excellent covering characteristics, excellent colorability, high dispersiveness, excellent weather resistance, and high chemical stability can be obtained.

An example of such a titanium oxide is, to be specific, $TiO_2$, (titanium oxide (IV), titanium dioxide).

The crystal structure of titanium oxides is not particularly limited, and include, for example, rutile, brookite, and anatase. A preferable example is rutile.

The crystal system of titanium oxides is not particularly limited. For example, the crystal system is a tetragonal system, or orthorhombic system. A preferable example is a tetragonal system (to be specific, rutile structure).

When the crystal structure and the crystal system of the titanium oxide are rutile and tetragonal system, respectively, even if the encapsulating resin layer 14 is exposed to a high temperature for a long period of time, reduction in reflectance of light (particularly to light having a wavelength of around 450 nm) can be prevented effectively.

The light reflection component is particulate, and its shape is not limited. The shape can be, for example, a spherical shape, a plate shape, or a needle shape. The average of the maximum length of the light reflection component (when spherical, its average particle size) is, for example, 1 to 1000 nm. The average of the maximum length is measured by using a laser diffraction/scattering particle size distribution analyzer.

The mixing ratio of the light reflection component relative to the encapsulating resin is, for example, 5 to 90 mass %, preferably 10 to 60 mass % in view of colorability and light reflectivity.

The above-described light reflection component is dispersed and mixed in the encapsulating material uniformly.

A filler can be further added to the encapsulating resin. That is, the filler can be used in combination with the light reflection component (to be specific, white pigment).

Examples of fillers include, known fillers excluding the above-described white pigment. To be specific, examples of fillers include inorganic fillers such as silica powder, talc powder, alumina powder, aluminum nitride powder, and silicon nitride powder.

In view of reducing the linear expansion coefficient of the encapsulating resin layer 14, preferably, silica powder is used as the filler.

Examples of silica powder include molten silica powder and crystalline silica powder. A preferable example is molten silica powder (that is, quartz glass powder).

Examples of the shape of the filler include a spherical shape, a plate shape, and a needle shape. In view of excellent filling performance and flowability, the shape of the filler is preferably spherical.

Therefore, as the silica powder, preferably, a spherical molten silica powder is used.

The average of the maximum length of the filler (when spherical, its average particle size) is, for example, 5 to 60 μm, preferably 15 to 45 μm. The average of the maximum length is measured by using a laser diffraction/scattering particle size distribution analyzer.

The mixing ratio of the filler is adjusted so that the total amount of the filler and the light reflection component relative to, for example, the encapsulating resin is 10 to 80 mass %, and in view of reducing the linear expansion coefficient and ensuring flowability, the mixing ratio of the total amount of the filler and the light reflection component relative to the encapsulating resin is adjusted to be preferably 25 to 75 mass %, and more preferably 40 to 60 mass %.

The encapsulating resin is prepared as an encapsulating resin composition, by blending the above-described encapsulating material, the light reflection component, and a filler to be added as necessary, and mixing the mixture uniformly. The encapsulating resin composition is formed into a paste, or a sheet.

To form the encapsulating resin layer 14, the above-described encapsulating resin composition is applied onto the optical semiconductor layer 3 including the electrode unit 4 by an application method using a laminator or an applicator to form a coating. Thereafter, when the encapsulating material is a thermosetting resin, the coating is cured by heating.

When the encapsulating resin composition is formed into a sheet, the encapsulating resin layer 14 can also be molded by placing the encapsulating resin composition on the optical semiconductor layer 3, and curing the encapsulating resin composition by heating.

Furthermore, when the encapsulating resin composition contains a powder thermosetting resin, the encapsulating resin layer 14 can also be molded by compression molding the encapsulating resin composition with a compression molding machine, while heating the encapsulating resin composition to be cured.

The encapsulating resin layer 14 is formed in this manner.

The encapsulating resin layer 14 thus covers the top face and the side face of the bump 13 corresponding to the anode 10; the top face (exposed from the bump 13) and the side face of the anode 10; the top face (exposed from the anode 10) and the side face of the transparent electrode 12; the top face and the side face of the P-semiconductor layer 9 exposed from the transparent electrode 12; and the side face of the light-emitting layer 8.

Furthermore, the top face and the side face of the bump 13 corresponding to the cathode 11; and the top face (exposed from the bump 13) and the side face of the cathode 11 are covered by the encapsulating resin layer 14.

Furthermore, the top face (top face of the N-semiconductor layer 7 exposed from the light-emitting layer 8 and the cathode 11) of the N-semiconductor layer 7 is also covered by the encapsulating resin layer 14.

The top face of the thus formed encapsulating resin layer 14 is formed above the top face of the electrode unit 4, that is, above the top face of the bump 13.

Length L1 between the top face of the encapsulating resin layer 14 and the top face of the bump 13 is, for example, 2000 μm or less, preferably 10 to 1000 μm.

Then, as shown in FIG. 1(c), the support substrate 2 is removed from the optical semiconductor layer 3.

For the removal of the support substrate 2, for example, etching such as dry etching, and wet etching, or machine processing such as grind processing (grinding) is used. Preferably, grinding is used.

Then, as shown in FIG. 2(d), the encapsulating resin layer 14 is partially removed so as to expose the top face of the electrode unit 4.

To be specific, in the encapsulating resin layer 14, the upper portion that is above the top face of the bump 13 is removed.

For the removal of the upper portion of the encapsulating resin layer 14, for example, the above-described etching, or machine processing is used.

The encapsulating resin layer 14 with its upper portion removed allows the top face of the bump 13 to be exposed, and allows the top face of the encapsulating resin layer 14 surrounding the top face of the bump 13 to be flush with the top face of the bump 13.

A plurality of light-emitting diode elements 20 are thus formed integrally, including a plurality of light-emitting laminates 5, the light-emitting laminate 5 including the optical semiconductor layer 3, the electrode unit 4, and the encapsulating resin layer 14.

Thereafter, as shown in the broken line (one dash) in FIG. 2(d), the light-emitting laminate plate 1 with the encapsulating resin layer 14 formed is cut (die cut) in correspondence with the light-emitting diode element 20.

That is, the light-emitting diode elements 20 are cut out from the light-emitting laminate plate 1. To be specific, the encapsulating resin layer 14, the buffer layer 6, and the N-semiconductor layer 7 surrounding the electrode unit 4, the light-emitting layer 8, and the P-semiconductor layer 9 are die cut along the thickness direction shown by the broken line (one dash) in FIG. 2(d).

The light-emitting diode elements 20 are obtained in this manner.

Next, in this method, as shown in FIG. 2(e), the light-emitting diode elements 20 are turned upside-down (reversed); the base substrate 16 is prepared; and the light-emitting diode elements 20 and the base substrate 16 are disposed to face each other.

The base substrate 16 is a generally flat plate. To be specific, the base substrate 16 is formed from a laminate plate in which a conductor layer formed into a circuit pattern is laminated on an insulating substrate. The insulating substrate is formed, for example, from a silicon substrate, a ceramic substrate, or a polyimide resin substrate. Preferably, the insulating substrate is formed from a ceramic substrate. The conductor layer is formed, for example, from a conductor such as gold, copper, silver, and nickel.

The conductor layer includes terminals 15.

The terminals 15 are formed on the surface of the insulating substrate into a pattern corresponding to the above-described bumps 13 of the light-emitting diode element 20. That is, terminals 15 are formed into a substantially same pattern as that of the bumps 13 after being turned over. The terminals 15 are formed, for example, from conductors such as gold, copper, silver, and nickel. These conductors can be used singly, or can be used in combination.

Thereafter, in this method, as shown in FIG. 2(f), the bumps 13 of the electrode unit 4 and the terminals 15 are electrically connected, thereby flip chip mounting the light-emitting diode element 20 on the base substrate 16.

In flip chip mounting, the light-emitting diode element 20 is placed on the base substrate 16 so that the bumps 13 and the terminals 15 are adjacent to each other in the thickness direction, and then the bumps 13 are allowed to reflow, for example, by heating or ultrasonic waves.

The bumps 13 are thus brought into contact with the terminals 15, and this allows the light-emitting diode elements 20 to be flip chip mounted on the base substrate 16. The light-emitting diode device 21 including the light-emitting diode element 20 and the base substrate 16 can be obtained in this manner.

In this light-emitting diode device 21, the encapsulating resin layer 14 contains the light reflection component, and therefore can exhibit light reflection function. Therefore, a trouble of providing a diffusion film separately from the encapsulating resin layer 14 can be avoided.

Thus, light-extraction efficiency of the light-emitting diode device 21 is improved, while production of the light-emitting diode device 21 can be made simple.

Furthermore, the encapsulating resin layer 14 is formed on the optical semiconductor layer 3 so as to cover the electrode unit 4, and the encapsulating resin layer 14 is partially removed so as to expose the top face of the electrode unit 4, and therefore faces of the electrode unit 4 other than the top face can be encapsulated with the encapsulating resin layer 14.

That is, the encapsulating resin layer 14 can encapsulate the side face of the bump 13 corresponding to the anode 10; the top face (exposed from the bump 13) and the side face of the anode 10; the top face (exposed from the anode 10) and the side face of transparent electrode 12; the top face (exposed from the transparent electrode 12) and the side face of the P-semiconductor layer 9; and the side face of light-emitting layer 8.

Furthermore, the encapsulating resin layer 14 can encapsulate the side face of the bump 13 corresponding to the cathode 11; and the top face (exposed from the bump 13) and the side face of the cathode 11.

Furthermore, the encapsulating resin layer 14 can encapsulate the top face of the N-semiconductor layer 7 exposed from the light-emitting layer 8 and the cathode 11.

That is, the encapsulating resin layer 14 can encapsulate the above-described faces of the electrode unit 4 while allowing the top face of the electrode unit 4, that is, top face of the bumps 13 to be exposed.

Therefore, damages to the electrode unit 4 due to the stress generated when the top face of the electrode unit 4 is allowed to be exposed, to be specific, damages to the electrode unit 4 due to vibrations generated in machine processing (grinding, etc.) can be prevented effectively.

In the embodiment shown by the solid line in FIG. 1(c), the support substrate 2 is entirely removed from the optical semiconductor layer 3. However, as shown by the phantom line in FIG. 1(c), it is also possible to remove only a lower portion of the support substrate 2.

For the removal of the lower portion of the support substrate 2, the above-described etching is used.

The thickness of the support substrate 2 after the removal of the lower portion relative to the thickness of the support substrate 2 before the removal is, for example, 80% or less, preferably 30% or less, and usually 1% or more, to be specific, for example, 320 µm or less, preferably 10 to 120 µm.

When the thickness exceeds the above-described range, light-extraction efficiency may decrease. On the other hand, when the thickness is below the above-described range, as described in the following, the optical semiconductor layer 3 may not be supported and effects of preventing damages to the electrode unit 4 may not be brought out sufficiently.

As shown by the phantom line in FIG. 1(c), when only the lower portion of the support substrate 2 is removed, in the removal of the upper portion of the encapsulating resin layer 14 shown in FIG. 2(d), the stress applied on the electrode unit 4 can be reliably supported by the remaining upper portion of the support substrate 2 through the optical semiconductor layer 3. Thus, damages to the electrode unit 4 can be further prevented.

On the other hand, as shown in the solid line in FIG. 1(c), when the support substrate 2 is removed entirely, in the light-emitting diode device 21 shown in FIG. 2(f), light emitted from the light-emitting diode element 20 upwardly will not be blocked, and therefore light-extraction efficiency can be improved.

EXAMPLES

While in the following, the present invention will be described with reference to Examples and Comparative Examples, the present invention is not limited thereto.

Example 1

A light-emitting laminate plate including a support substrate, an optical semiconductor layer formed thereon, and an electrode unit formed thereon was prepared (ref: FIG. 1(a)).

To prepare a light-emitting laminate plate, first, a support substrate composed of sapphire and having a thickness of 450 µm was prepared, and then the following were laminated in the above-described pattern sequentially on the support substrate by epitaxy: a buffer layer composed of GaN and having a thickness of 30 nm; an N-semiconductor layer composed of Si-doped N-GaN (hereinafter referred to as n-GaN: Si) and having a thickness of 5 µm; a light-emitting layer composed of InGaN and having a thickness of 120 nm; and a P-semiconductor layer composed of n-GaN: Mg and having a thickness of 50 nm. The light-emitting layer and the P-semiconductor layer were formed into the above-described pattern by etching after epitaxy.

Thereafter, a transparent electrode composed of ITO and having a thickness of 50 nm was formed on the P-semiconductor layer, and then an anode composed of gold and having a thickness of 50 nm was formed on the transparent electrode. At the same time, a cathode composed of gold and having a thickness of 50 nm was formed on the N-semiconductor layer.

Then, bumps composed of gold were formed on the anode and on the cathode.

The thickness of the bump on the anode and the thickness of the bump on the cathode were adjusted so that their heights were the same when the top faces of these bumps were projected in the surface direction.

Then, the encapsulating resin layer was formed on the optical semiconductor layer so as to cover the electrode unit (ref: FIG. 1(b)).

To be specific, first, 100 parts by mass of a thermosetting silicone resin, and 20 parts by mass of spherical titanium oxide ($TiO_2$: tetragonal system rutile) particles having an average particle size of 300 nm were mixed uniformly, thereby preparing a paste encapsulating resin composition.

Then, the prepared encapsulating resin composition was applied on the optical semiconductor layer including the electrode unit, thereby forming a coating.

Thereafter, the coating was cured by heating.

The top face of the encapsulating resin layer was formed to be above the top face of the bumps by 30 µm (L1).

Thereafter, the support substrate was removed by etching from the optical semiconductor layer (ref: solid line in FIG. 1(c)).

Then, the upper portion (thickness 30 µm) of the encapsulating resin layer was removed by grind processing (grinding) so that the top face of the electrode unit was exposed. The upper portion of the encapsulating resin layer was removed so that the top face of the electrode unit was flush with the top face of the encapsulating resin layer surrounding the electrode unit (ref: FIG. 2(d)).

A plurality of light-emitting diode elements were formed integrally.

Thereafter, the light-emitting laminate plate was die cut to cut out the light-emitting diode elements from the light-emitting laminate plate (ref: broken line (one dash) FIG. 2(d)).

Thereafter, the light-emitting diode elements were reversed, and a base substrate having a thickness of 1 mm was prepared. In the base substrate, a conductor layer including terminals composed of copper, nickel, and gold was laminated on the surface of an insulating substrate composed of sapphire ($Al_2O_3$). The light-emitting diode element and the base substrate were disposed to face each other (ref: FIG. 2(e)).

Thereafter, the bumps were allowed to reflow by heating so that the bumps and the terminals were brought into contact with each other, and these were electrically connected directly, thereby flip chip mounting the light-emitting diode element on the base substrate (ref: FIG. 2(f)). A light-emitting diode device was made in this manner.

Example 2

A light-emitting diode element was obtained in the same manner as in Example 1, except that only a lower portion (thickness 420 µm) of the support substrate was removed (ref: phantom line in FIG. 1(c)) instead of entirely removing the support substrate from the optical semiconductor layer (ref: solid line in FIG. 1(c)). Thereafter, the light-emitting diode element thus obtained was flip chip mounted on the base substrate, thereby producing a light-emitting diode device (ref: phantom line FIG. 2(f)).

That is, as shown by the phantom line in FIG. 1(c), the upper portion of the support substrate remained, and the upper portion had a thickness of 30 µm.

Comparative Example 1

A light-emitting diode element was obtained in the same manner as Example 1, except that the step of removing the support substrate from the optical semiconductor layer (ref: solid line in FIG. 1(c)) was not performed, and then the light-emitting diode element thus obtained was flip chip mounted on the base substrate, thereby producing a light-emitting diode device (ref: phantom line in FIG. 2(f)).

That is, as shown in FIG. 1(b), the support substrate remained entirely.

Evaluation

1. Examination of Electrode Unit

The light-emitting diode devices of Examples 1 and 2 were cut along the thickness direction, thereby producing samples. The sample electrode units were observed with a scanning electron microscopy (SEM), and it was confirmed that no damages were found in the electrode units.

2. Measurement on Light-Extraction Efficiency

The light-extraction efficiency of light-emitting diode devices of Examples 1 and 2, and Comparative Example 1 were obtained by calculation based on the radiant flux.

It was confirmed from the result that the light-extraction efficiencies of the light-emitting diodes of Examples 1 and 2 were higher than that of the light-emitting diodes of Comparative Example 1 by 10% and 3%, respectively.

While the illustrative embodiments of the present invention are provided in the above description, such is for illustrative purpose only and it is not to be construed as limiting the scope of the present invention. Modifications and variations of the present invention that will be obvious to those skilled in the art is to be covered by the appended claims.

What is claimed is:

1. A method for producing a light-emitting diode device comprising the steps of:
    preparing a light-emitting laminate including an optical semiconductor layer, and an electrode unit formed on the optical semiconductor layer,
    forming an encapsulating resin layer on the optical semiconductor layer so as to cover the entire electrode unit, the encapsulating resin layer containing a light reflection component,
    partially removing the encapsulating resin layer so as to expose the top face of the electrode unit, thereby producing a light-emitting diode element, and
    disposing the light-emitting diode element and a base substrate provided with terminals so that the light-emitting diode element and the base substrate face each other, and that the electrode unit and the terminals are electrically connected, thereby flip chip mounting the light-emitting diode element on the base substrate.

2. The method for producing a light-emitting diode device according to claim 1, wherein in the step of preparing the light-emitting laminate, the light-emitting laminate is formed on the support substrate, and
    the method further includes
    a step of removing the support substrate from the optical semiconductor layer or removing a lower portion of the support substrate, after the step of forming the encapsulating resin layer and before the step of producing a light-emitting diode element.

* * * * *